United States Patent [19]
O'Farrell

[11] 4,023,026
[45] May 10, 1977

[54] PSEUDO-RANDOM CODER WITH IMPROVED NEAR RANGE REJECTION

[75] Inventor: Francis J. O'Farrell, Valencia, Calif.

[73] Assignee: International Telephone and Telegraph Corporation, New York, N.Y.

[22] Filed: Dec. 15, 1975

[21] Appl. No.: 640,640

[52] U.S. Cl. ............................... 235/152; 331/78
[51] Int. Cl.² ......................................... G06F 1/02
[58] Field of Search ...................... 235/152; 331/78; 340/348

[56] References Cited
UNITED STATES PATENTS

| | | | |
|---|---|---|---|
| 3,609,327 | 9/1971 | Paine et al. | 235/152 |
| 3,614,400 | 10/1971 | Farnett et al. | 235/152 |
| 3,700,869 | 10/1972 | Low et al. | 235/152 |

OTHER PUBLICATIONS

D. Lancaster, "Understanding Pseudo-Random Circuits," *Radio–Electronics*, Apr. 1975, pp. 42–43 & 48–49.

*Primary Examiner*—David H. Malzahn
*Attorney, Agent, or Firm*—William T. O'Neil

[57] ABSTRACT

A modified maximal length PRC (pseudo-random code) sequence generator for use in autocorrelating systems such as CW, bi-phase modulated PRC radar systems. The code generator for the system is a modified version of a known shift register and feedback arrangement, which provides a wordlength of $2^n - 1$ as known in the prior art. Means are shown for adding a zero in the sequence of $n-1$ zeroes which always occur within the PRC word according to pseudo-noise theory. The result is an autocorrelation function having no residual value for several bits on either side of the correlation peak, thereby providing a theoretically infinite range discrimination in the near vicinity of a true range value.

10 Claims, 6 Drawing Figures

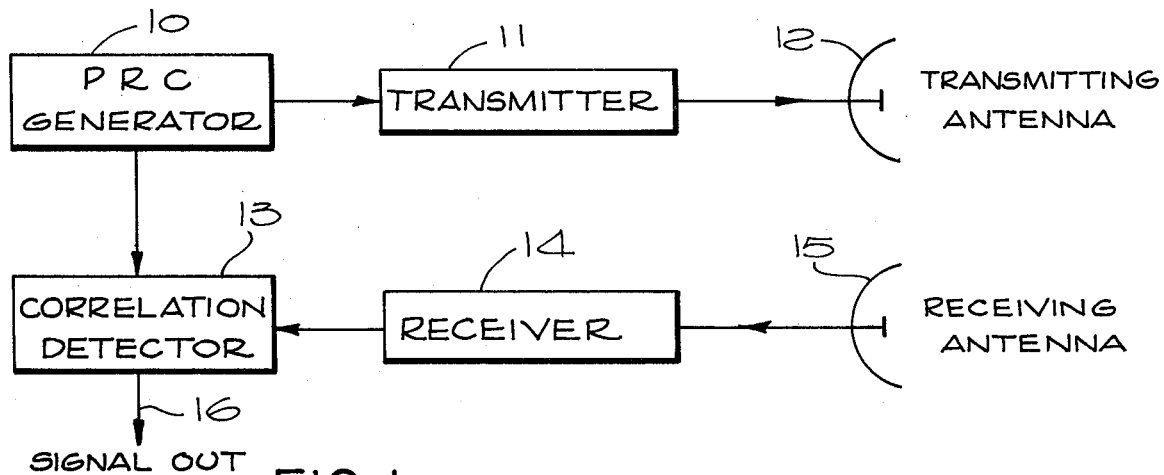
FIG. 1: TYPICAL PRC RADAR SYSTEM
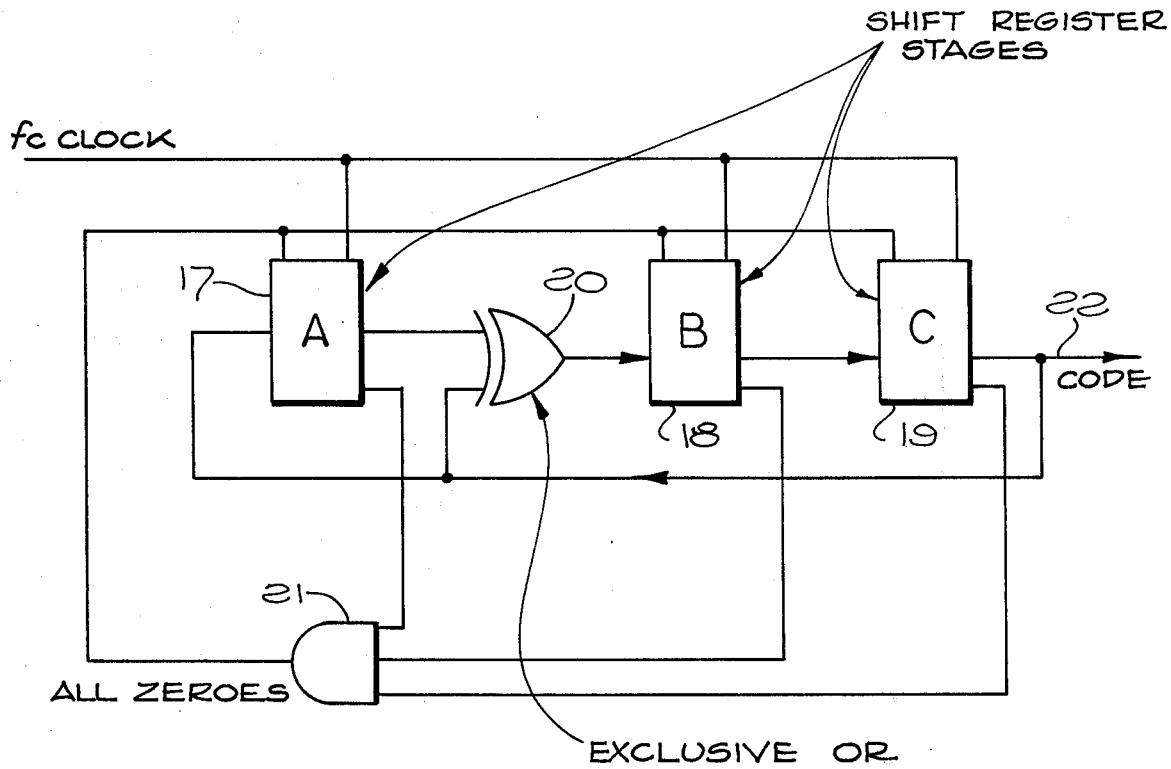
FIG. 2: TYPICAL 3-STAGE MAXIMUM LENGTH SEQUENCE (PSEUDO-NOISE) CODE GENERATOR

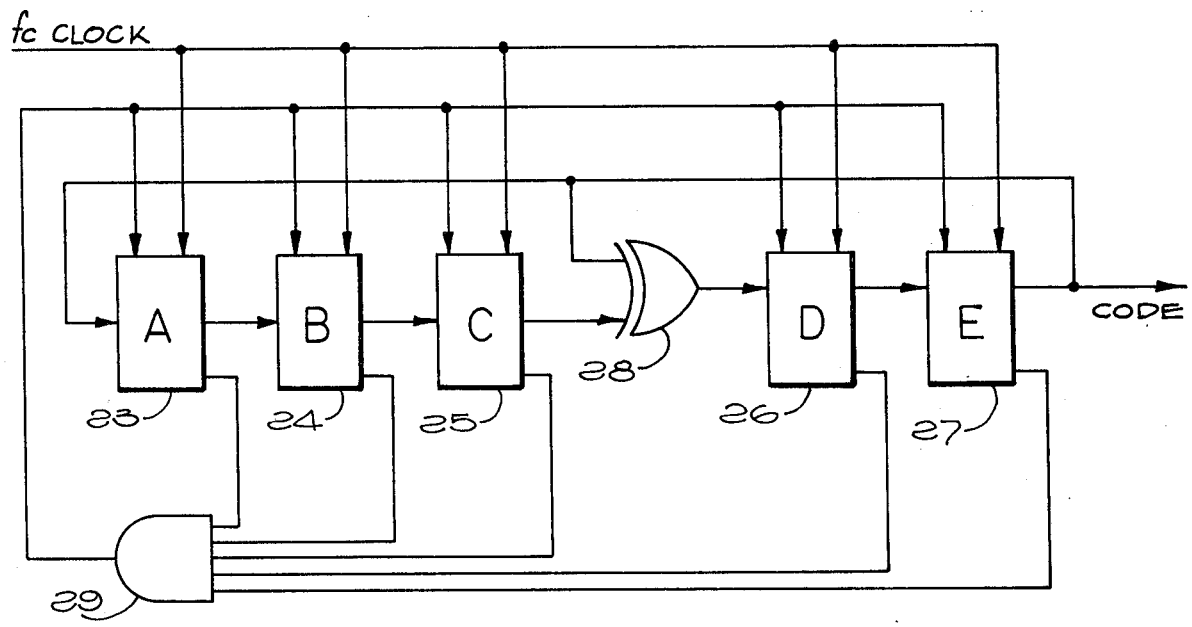
FIG.3: TYPICAL 5-STAGE BASIC CODER
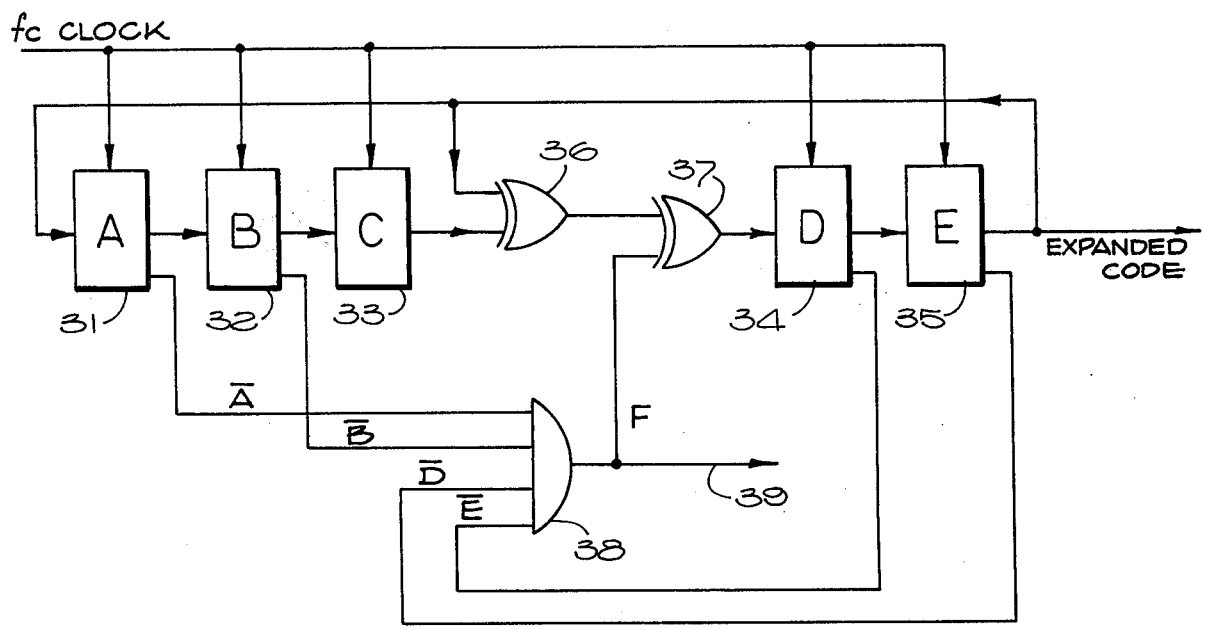
FIG.4: 5-STAGE EXPANDED CODE GENERATOR SYSTEM LOGIC

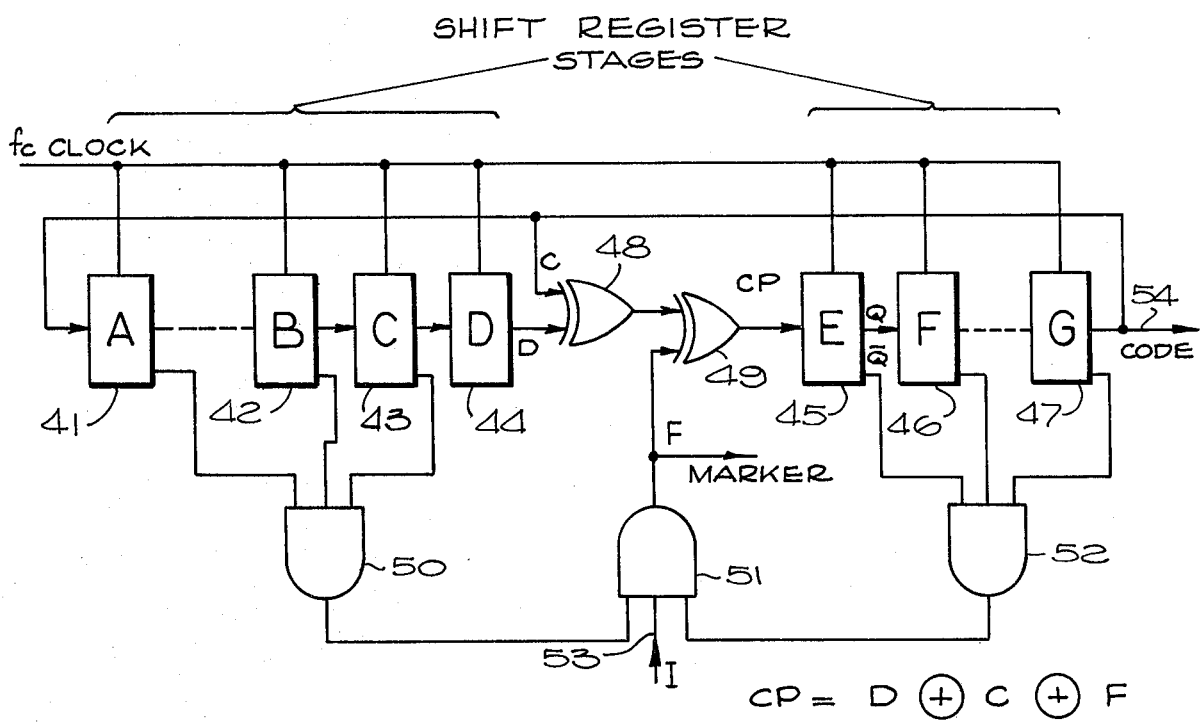
FIG.5: EXPANDED CODE GENERATOR — GENERAL FORM
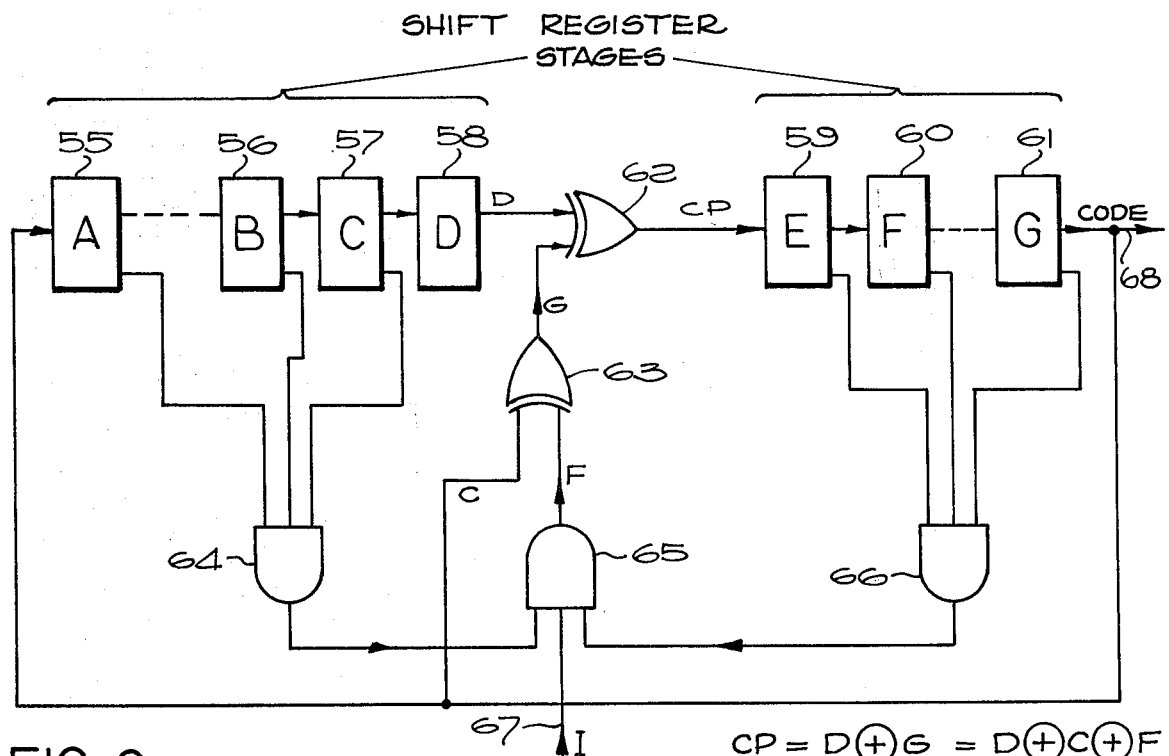
FIG.6: EXPANDED CODE GENERATOR ALTERNATE

PSEUDO-RANDOM CODER WITH IMPROVED NEAR RANGE REJECTION

BACKGROUND OF THE INVENTION

1. Field of the Invention

The invention relates to electronic autocorrelating signal systems employing maximal length PRC coding, and more particularly, to PRC radar systems.

2. Description of the Prior Art

In the prior art the concept of autocorrelation of a given pseudorandom coded (PRC) waveform against the same waveform provided through another route, as for example, as a radar echo, has been widely and advantageously used, not only in the radar arts, but in certain other specialized areas.

For a background in connection with the general technique of pseudo-noise or pseudo-random coded system technology, the reader is referred to the technical literature. In particular, the text "Radar Handbook", by Merrill I. Skolnik (McGraw-Hill, 1970) describes the state of this art in respect to radar systems relatively currently, and provides extensive bibliographic references. See Chapter 20, Section 20.5 of that text, in particular. In general, the pseudo-random coded waveform is generated by digital techniques, and is imposed as a modulation on a radio-frequency carrier which may be transmitted toward distant points or targets. Received echoes as a result of those transmissions bear the same, usually bi-phase modulation, corresponding to a pseudo-random sequence of "ones" and "zeroes". The autocorrelation process is then applied, and such systems are known to provide certain distinct advantages, among these being implementation of pulse compression, and the provision of good signal-to-noise ratios in an arrangement which is relatively immune to certain types of interference.

Additional references for an understanding of the basic techniques involved as background of the present invention may be found in two other texts, namely; "Radar Design Principles" by F. Nathanson, (Chapter 12, in particular) and "Modern Radar", by R. S. Berkowitz, (John Wiley, publisher), (Chapter 4, in particular).

The use of the pseudo-random coded technique for a non-radar application is described in U.S. patent application, Ser. No. 458,808, filed Apr. 8, 1974, entitled: "Large Area Motion Sensor Using Pseudo-Noise Technique" and now abandoned. That application is assigned to the assignee of the present application.

pseudo-random coded systems may be of the pulse type, or more commonly, are of the CW type. The term maximal length sequence applies to CW systems in which one transmitted pseudo-random coded word is transmitted repetitively without hiatus between the end of one word and the beginning of the next. It is this type of system to which the present invention is particularly applicable, and the description hereinafter presumes that type of system.

A typical maximal length sequence generator produces a code of length L binary bits. Quite commonly, a shift-register/feedback arrangement is employed, and if $n$ is the number of stages of the shift register, the word-length may be described as $L = 2^n - 1$. Accordingly, a three-stage sequence generator produces a code of $L = 2^3 - 1 = 7$ bits, and a five-stage sequence generator produces a code of $L = 2^5 - 1 = 31$ bits. These sequences are repetitive and the individual bits are either "ones" or "zeroes". In a five-stage generator, the number of ones is given by $2^n/2 = 32/2 = 16$, and the number of zeroes is given by $(2^n/2) - 1 = 16 - 1 = 15$, thus the number of logical zeroes is always one less than the number of logical ones.

The average value of the waveform of such a sequence is therefore 1/L, i.e., 1/7 for the three stage coder example and 1/31 for the 31 bit codeword generated by the five-stage sequence generator. The DC term of power spectrum may be thought of as $(1/L)^2$, or 1/961 for the five-stage coder.

Typical examples of prior art three and five-stage maximal length sequence generators are shown in the drawings and will be appropriately described hereinafter in connection with the description of the preferred embodiments. Although those prior art configurations do not include the present invention, a clear understanding of them is necessary in order to appreciate the significance of the present invention.

In accordance with the foregoing, it wil be realized that prior art pseudo-random sequence coders inherently generate a code which, although optimum in certain applications, does, nevertheless, correlate out with a residue on either side of the autocorrelation peak which is other than zero. In the typical ranging situation using a pseudo-random coded technique, the received code "slips by" the transmitted code as a result of relative sending and receiving station range changes, the maximum correlator output occurring when code words are perfectly matched. Thus, when the code is multiplied by itself and integrated (the autocorrelation process), the autocorrelated value reaches a peak when the codes are aligned exactly, but for each integer bit of slippage between the two multiplied codes, the value is $-1/L$ that of the peak value.

For certain precision range measuring applications, the fact that there is a residue on either side of the autocorrelation peak tends to be disadvantageous since the autocorrelation peak is thereby less sharply defined than would be the case if there were no residue.

The manner in which the present invention deals with the said autocorrelation residue problem will be understood as this description proceeds.

SUMMARY OF THE INVENTION

The invention comprises an "expanded " coder for use in pseudo-random sequence (sometimes called Pseudo-noise) arrangements as afore-mentioned. Basically, the expanded coder is constructed and operates the same as a typical maximal length sequence code generator with a few exceptions to be described, the most significant of these being that it logically adds a logic zero to the sequence. In the typical prior art pseudo-random sequence there will always be a string of $n-1$ zeroes within the binary states (serial bits) comprising each word of the sequence. The device of the invention adds a zero in the sequence to this $n-1$ string of zeroes, thereby providing an expanded string of $n$ zeroes within each word. The wordlength is thereby increased by one bit providing $2^n$ bits per word. Whereas the prior art maximal length sequence generator cannot cycle through the all zero state because it would remain in that state, the expanded coder can and does cycle through that state producing the same code for a given number of stages with the exception of the aforementioned added zero. In the expanded code, the average value is zero and not 1/L as it is for the prior art maximal length sequence.

The details of a typical instrumentation embodying the invention will be described and understood hereinafter.

BRIEF DESCRIPTION OF THE DRAWINGS

FIG. 1 is a system block diagram of a typical PRC radar system, such as might employ the coder of the present invention.

FIG. 2 is a typical three-stage maximal length PRC sequence generator as found in the prior art.

FIG. 3 is a typical five-stage basic coder according to the prior art.

FIG. 4 is a five-stage expanded code generator system logic block diagram according to the present invention.

FIG. 5 is an expanded code generator in general form according to the present invention.

FIG. 6 is an alternative form of expanded code generator in accordance with the present invention.

DESCRIPTION OF THE PREFERRED EMBODIMENTS

Referring now to FIG. 1, there is shown a block diagram of a typical CW PRC radar system, which may use a PRC generator 10 of the prior art type, or of the type described in connection with the present invention. The pseudo-random sequence from 10 is supplied as a modulating signal to transmitter 11 which thereafter energizes the transmitting antenna 12 with a radio-frequency signal from 11 which bears the pseudo-random sequence as a modulation envelope in the form of a bi-static phase modulation (bi-phase modulation). The pseudo-random sequence is also supplied locally to a correlation detector 13 which is no different basically whether or not the generator 10 is of the form of the present invention or not. Correlation detector 13 multiplies the received echo signal from objects illuminated by the transmitting antenna 12 which pass into receiving antenna 15, and are conventionally processed by receiver 14 to produce a duplicate pseudo-random sequence (or sequences from plural targets), which are then multiplied by the local code from 10 in a detector 13. The result is a signal output 16 comprising the autocorrelation functions of all received signals against the local code. The aforementioned textbook "Modern Radar", particularly Chapter 4 of that reference, is especially pertinent in understanding the nature of this correlation process. The exact nature of the components of FIG. 1 is, of course, well understood by those skilled in this art, except for the coder itself according to the invention described herein.

The form of the so-called autocorrelation function is graphically illustrated in FIG. 4-2 of the aforementioned "Modern Radar" reference.

Referring now to FIG. 2, a typical prior-art, three-stage, maximal length sequence code generator is illustrated. This device comprises a shift register having three stages, A, B and C, also identified as 17, 18 and 19, respectively. The other basic elements of the combination in FIG. 2 are the feedback circuit and a self-start circuit. The feedback logic includes an exclusive OR 20. Consider the shift register states as the shift register is advanced step-by-step by a clock pulse of frequency $f_c$ in the usual shift register timing configuration, as illustrated. Initially, assume an arbitrary state of the generator such that all ones are extant, i.e., each stage of the shift register is in the logic one state. The operation is such that the feedback signal C is subjected to the operation of the exclusive OR circuit 20 against the contents of the shift register stage, resulting in a new state after each clock pulse. That sequence continues for seven states and then repeats. Note that, if all register stages pass through the zero state at the same time, the coder sequence generator will stop and remain in this state for all successive clock pulses, except that is, for the operation of the AND gate 21. AND gate 21 has three inputs which, if all are zero, automatically operates to preset all register stages, i.e., to the all ones condition. Note again, that if the device of FIG. 2 is used to provide the function of the generator 10 in FIG. 1, the autocorrelation function reaches a peak out of the correlator "multiplier" 13 at lead 16 when local and received codes are exactly aligned. For each integer bit of slippage between the local code from 10 and the received code out of 14, the value is $-1/L$, the value of the peak itself being L. From this, the relative energy in an adjacent channel is reduced by $-20 \log L$ in decibels, this because power varies as a square of voltage.

From the device of FIG. 2, a code or pseudo-random sequence on lead 22 is that which is supplied to both transmitter 11 and correlation detector 13 in FIG. 1.

Referring now to FIG. 3, a typical five-stage basic coder, also prior art, per se, is illustrated. Register stages A through E, also identified as 23, 24, 25, 26 and 27 are used. The operation of the AND circuit 29 in preventing the "zeroes lock-up" condition is essentially the same as that for FIG. 2. The feedback paths, including the exclusive OR circuit 28, are such that the output signal on lead 30, i.e., the pseudo-random sequence or code, assumes 31 states before repeating. This is consistent with the formula $L = 2^n - 1$, i.e., the wordlength $L = 31$, corresponding to $n = 5$. Table I following, relates these 31 bits of the code sequence at lead 30 from the register stage 27 to the individual register stage conditions.

TABLE I

| State | A | B | C | D | E | State | A | B | C | D | E |
|---|---|---|---|---|---|---|---|---|---|---|---|
| 1 | 1 | 1 | 1 | 1 | 1 | 17 | 1 | 0 | 0 | 1 | 0 |
| 2 | 1 | 1 | 1 | 0 | 1 | 18 | 0 | 1 | 0 | 0 | 1 |
| 3 | 1 | 1 | 1 | 0 | 0 | 19 | 1 | 0 | 1 | 1 | 0 |
| 4 | 0 | 1 | 1 | 1 | 0 | 20 | 0 | 1 | 0 | 1 | 1 |
| 5 | 0 | 0 | 1 | 1 | 1 | 21 | 1 | 0 | 1 | 1 | 1 |
| 6 | 1 | 0 | 0 | 0 | 1 | 22 | 1 | 1 | 0 | 0 | 1 |
| 7 | 1 | 1 | 0 | 1 | 0 | 23 | 1 | 1 | 1 | 1 | 0 |
| 8 | 0 | 1 | 1 | 0 | 1 | 24 | 0 | 1 | 1 | 1 | 1 |
| 9 | 1 | 0 | 1 | 0 | 0 | 25 | 1 | 0 | 1 | 0 | 1 |
| 10 | 0 | 1 | 0 | 1 | 0 | 26 | 1 | 1 | 0 | 0 | 0 |
| 11 | 0 | 0 | 1 | 0 | 1 | 27 | 0 | 1 | 1 | 0 | 0 |
| 12 | 1 | 0 | 0 | 0 | 0 | 28 | 0 | 0 | 1 | 1 | 0 |
| 13 | 0 | 1 | 0 | 0 | 0 | 29 | 0 | 0 | 0 | 1 | 1 |
| 14 | 0 | 0 | 1 | 0 | 0 | 30 | 1 | 0 | 0 | 1 | 1 |
| 15 | 0 | 0 | 0 | 1 | 0 | 31 | 1 | 1 | 0 | 1 | 1 |
| 16 | 0 | 0 | 0 | 0 | 1 | 1 | 1 | 1 | 1 | 1 | 1 |

As hereinbefore indicated, a sequence of $n-1$, where $n$ is the number of register stages, zeroes occur in a string. In Table I these zeroes are for a number and are found between states 12 and 15, inclusive. According to the present invention, the expansion of this code by increasing the number of zeroes to $n$, is accomplished in accordance with the invention as depicted in FIGS. 4, 5 and 6 and Table II following:

TABLE II

| A | B | C | D | E | F | G | CP | STATE |
|---|---|---|---|---|---|---|---|---|
| 1 | 1 | 1 | 1 | 1 | 0 | 1 | 1 | 1 |
| 1 | 1 | 1 | 0 | 1 | 0 | 0 | 0 | 2 |
| 1 | 1 | 1 | 0 | 0 | 0 | 0 | 0 | 3 |

TABLE II-continued

| A | B | C | D | E | F | G | CP | STATE |
|---|---|---|---|---|---|---|----|-------|
| 0 | 1 | 1 | 1 | 0 | 0 | 1 | 1 | 4 |
| 0 | 0 | 1 | 1 | 1 | 0 | 1 | 1 | 5 |
| 1 | 0 | 0 | 1 | 1 | 0 | 0 | 0 | 6 |
| 1 | 1 | 0 | 1 | 0 | 0 | 1 | 1 | 7 |
| 0 | 1 | 1 | 0 | 1 | 0 | 0 | 0 | 8 |
| 1 | 0 | 1 | 1 | 0 | 0 | 0 | 0 | 9 |
| 0 | 1 | 0 | 1 | 0 | 0 | 1 | 1 | 10 |
| 0 | 0 | 1 | 0 | 1 | 0 | 0 | 0 | 11 |
| 1 | 0 | 0 | 0 | 0 | 0 | 0 | 0 | 12 |
| 0 | 1 | 0 | 0 | 0 | 0 | 0 | 0 | 13 |
| 0 | 0 | 1 | 0 | 0 | 0 | 0 | 0 | 14 |
| 0 | 0 | 0 | 0 | 0 | 1 | 1 | 0 | 15 |
| 0 | 0 | 0 | 1 | 0 | 1 | 0 | 1 | 16 |
| 0 | 0 | 0 | 0 | 1 | 0 | 0 | 0 | 17 |
| 1 | 0 | 0 | 1 | 0 | 0 | 1 | 1 | 18 |
| 0 | 1 | 0 | 0 | 1 | 0 | 0 | 0 | 19 |
| 1 | 0 | 1 | 1 | 0 | 0 | 1 | 1 | 20 |
| 0 | 1 | 0 | 1 | 1 | 0 | 1 | 1 | 21 |
| 1 | 0 | 1 | 1 | 1 | 0 | 1 | 1 | 22 |
| 1 | 1 | 0 | 0 | 1 | 0 | 0 | 0 | 23 |
| 1 | 1 | 1 | 1 | 0 | 0 | 1 | 1 | 24 |
| 0 | 1 | 1 | 1 | 1 | 0 | 1 | 1 | 25 |
| 1 | 0 | 1 | 0 | 1 | 0 | 0 | 0 | 26 |
| 1 | 1 | 0 | 0 | 0 | 0 | 0 | 0 | 27 |
| 0 | 1 | 1 | 0 | 0 | 0 | 0 | 0 | 28 |
| 0 | 0 | 1 | 1 | 0 | 0 | 1 | 1 | 29 |
| 0 | 0 | 0 | 1 | 0 | 1 | 1 | 1 | 30 |
| 1 | 0 | 0 | 1 | 1 | 0 | 1 | 1 | 31 |
| 1 | 1 | 0 | 1 | 1 | 0 | 1 | 1 | 32 |

Table II depicts the operation of the coder according to the present invention. It will be noted that the output stage, for example stage 35 of FIG. 4, as extant at output code terminal 40, is shown to provide the desired string of $n = 5$ zeroes between the 12th and 16th register states inclusive.

For the five-stage register configuration of FIG. 4, the logic equations are given as follows:

$$F = \bar{A} \cdot \bar{B} \cdot \bar{D} \cdot \bar{E}$$
$$G = C \oplus E$$
$$CP = C \oplus E \oplus F$$

As hereinbefore indicated, the expanded coder according to the invention, basically operates the same as the typical maximum length sequence code generator of the prior art with the exception that it logically adds a logical zero to the sequence. Whereas, the prior art maximal length sequence generator cannot cycle through the all zero state the expanded coder can and does cycle through that state to produce the new code including the added zero, but otherwise configured the same before and after the added zero.

It will be noted that the average value of this expanded code is not 1/L, as it was for the maximum length prior art sequence, but rather is now zero.

As the shift register advances at the cadence determined by the clock pulse $f_c$ AND circuit (gate) 38 monitors the states of register stages A, B, D and E, i.e., 31, 32, 34 and 35 of FIG. 4. At the instant of state 14 depicted in Table II, these stages are in the logic zero condition and register stage C is initially in a logic one state. The exclusive OR gate 36 with output at G, then generates a logic one which, when combined with F from 38 in exclusive OR circuit 37 (F being a logic one at that time) produces a logic output zero at CP on the output of 37. At the next clock pulse, the logic zero of CP is shifted into register stage D 34 on FIG. 4. All five stages A, B, C, D and E, corresponding to 31, 32, 33, 34 and 35 are now in the logic zero state (state 15 of Table II). Accordingly, the output of the AND gate 38 at F remains at logic one, corresponding to output 39. Since the output of 33 is now in the logic zero state, the output of exclusive OR circuit 36 at G will be a logic zero and the output of exclusive OR 37 at CP will be a logic one. On the next succeeding clock pulse, the logic one of CP will be shifted into register stage D and the output of the AND circuit 38 will drop back to a logic zero state and remain there until the next cycle (word) which recurs each $L_E = 2^n$ bits where $L_E$ is the extended code word length and $n$ is the number of register stages as before.

It will be noted that insertion of the extra logic zero causes the overall logic to slip one bit, i.e., the ordinary maximal length coder would normally go from state 00100 to state 00010 by advancing the logic one from C to D. The extended coder however, goes from the aforementioned state 00100 to 00000 next, and then to state 00010. As previously indicated, the cross-correlation function, such as provided at the output 16 on FIG. 1, has the property of zero residue for several bits on either side of the cross-correlation peak. Stated otherwise; in a cross correlation process on a bit-by-bit basis, the sum of the agreements minus the disagreements is zero when the expanded code is multiplied by itself, delayed one-bit averaged over the word cycle, and likewise, for 2, 3 and 4 bits of delay or slip. After that, non-zero values are encountered, but the objective of sharpening the ratio of correlation peak to non-correlation (slip) values at "near ranges" has been accomplished.

The pattern of consecutive zeroes before and after the cross-correlation peak has been shown empirically to follow a rule $\pm (n-1)$ in that, for any length coder consisting of $n$ register stages, the correlation function will be zero for $m-1$ bits before the main peak and will be zero for $m-1$ bits following the main peak.

FIG. 5 may be thought of as illustrating the expanded code generator according to the invention in generalized form. Seven arbitrary register stages A through G comprising stages 41, 42, 43, 44, 45, 46 and 47, are shown, these being the flip-flop circuits commonly employed as register stages, having Q and $\bar{Q}$ outputs. The AND circuit logic is, in all cases, responsive to the $\bar{Q}$ outputs. Two AND gates 50 and 52 sense the register stage output conditions to detect the (0-----00100-----0) state at which time the output F of the AND circuit 51 responding to the 50 and 52 outputs, becomes a logic one. Since D (the output of 44 is first a logic one, and C is a logic zero, then the exclusive OR operation of 48 which is C⊕D yields a logic one which, when applied to exclusive OR 49 with F output (of 51) yields a logic zero at CP the output of exclusive OR gate 49.

The clock pulse $f_c$ is supplied as previously, and the next clock pulse causes the coder register stages to be all zeroes (0-----00000-----0). However, the marker signal F still remains a logic zero but CP now becomes a logic one. On the next succeeding clock pulse, the coder register assumes the (0-----00010-----0) state, which is the state that it would normally assume in the prior art non-expanded maximal length sequence case previously described. The code output C at 54 is therefore $2^n$ bits per word where $n$ is the generalized number of stages, for example, 7 stages as arbitrarily depicted in FIG. 5.

An input I at 53 serves to provide a switching function, whereby a logic one applied at 53 allows the expanded code operation in accordance with the invention, but a logic zero applied at 53 causes the circuit to revert to the basic maximal length sequence operation according to the prior art configuration. This switching operation is provided in order that the utilizing PRC system may operate in accordance with the present invention where this is advantageous and may be switched to the more conventional prior art type of operation where that is considered advantageous.

In FIG. 6, an alternative form of the general expanded coder of FIG. 5 is depicted. In this alternate embodiment, manipulation of the logic equations yields this alternative instrumentation. The logic operation producing the signal CP at the output of exclusive OR 55 remains the same as described in connection with FIG. 5. The register stages in FIG. 6, A through G, are identified as 41 through 47, respectively, as are AND circuits 50, 51 and 52, the same as in FIG. 5, since their functions and the function of the I switching signal at 53 are the same as described in connection with FIG. 5. The code available at terminal 57 is the same as that available at 54 in FIG. 5, however, the logic equations for FIG. 6 are as follows:

$$CP = D \oplus G = D \oplus C \oplus F$$
$$G = C \oplus F$$

In FIG. 6 the signals C and F are supplied to the exclusive OR circuit to produce the output signal G which, along with Q of D is applied to exclusive OR circuit 55 to produce the signal CP. Insofar as the development of the code in accordance with the invention at terminal 57 is concerned, the operation of FIG. 6 may be said to produce the same result as that of FIG. 5.

Various modifications and alterations of the embodiments described may suggest themselves to those skilled in this art, however, the scope of the present invention is not intended to be limited by the embodiments shown in the drawings or described in this description, these being illustrative only.

What is claimed is:

1. A system for generating a maximum length pseudo-random code, including digital word means for generating a repetitive serial digital word of L bits as a psdueo-random sequence, where $L = 2^n$ and $n =$ the number of stages in said digital word means, each of said stages being capable of assuming a first or second binary condition, the combination comprising:

first means connected to respond to said binary condition of a predetermined number of said stages to produce an identifying signal for the instantaneous code condition corresponding to the presence of the $(n-1)$th successive contiguous digit having a value corresponding to said first binary condition;

and second means responsive to said identifying signal from said first means, for generating the next code digit having a value corresponding to said first binary condition, said system being connected to thereafter continue to generate the digits of said code through the $2^n$th digit.

2. Apparatus according to claim 1, in which said first and second binary conditions are defined as logical ones and zeroes, respectively.

3. Apparatus according to claim 1 in which said digital word means is a digital shift register responsive to a clock pulse signal and means for providing feedback in a manner such that said repetitive serial digital word is pseudo-random sequence.

4. A pseudo-random coded digital sequence generator having a code output terminal and comprising:

a plurality of $n$ stages comprising a digital shift register, each of said register stages being a bi-stable device having Q and $\overline{Q}$ outputs, stages being responsive to a clock pulse, the $\overline{Q}$ output of each stage being connected to control the binary condition of a next successive stage concurrent with a clock pulse;

a first logic circuit arrangement responsive to a predetermined arrangement of said bi-stable stage $\overline{Q}$ outputs to provide a control signal at a time when said $\overline{Q}$ outputs assume a predetermined pattern corresponding to occurrence of a string of $n-1$ consecutive zeroes in said pseudo-random sequence;

and a second logic circuit arrangement responsive to said control signal and the $\overline{Q}$ output of a predetermined one of said register stages to control the next successive register stage to modify the signal thereby controlling the binary condition of said next successive register stage to produce an additional zero in said pseudo-random sequence within said string of consecutive zeroes.

5. Apparatus according to claim 4 in which said bi-stable register stages are flip-flop circuits.

6. Apparatus according to claim 4 in which said second logic circuit arrangement is further defined as containing circuits operating to add said additional zero after the occurrence of said string of $n-1$ zeroes in response to said control signal generated concurrently with the $n-1$ the zero in said pseudo-random sequence.

7. Apparatus according to claim 6 in which said second logic circuit arrangement comprises first and second exclusive OR circuits, each having two inputs and an output, the inputs of said first exclusive OR circuit being connected one to said code output terminal and the other to said predetermined register stage Q output, said second exclusive OR circuit having its input connected, one to the output of said first exclusive OR circuit and the other to the output of said first means, said second exclusive OR circuit output being connected to provide the connection to said succeeding register stage following said predetermined register stage.

8. Apparatus according to claim 6 in which said first logic circuit arrangement comprises at least one logical AND circuit providing $n-1$ inputs and an output providing said control signal.

9. Apparatus according to claim 8 in which said second logic circuit arrangement comprises first and second exclusive OR circuits, each having two inputs and an output, the inputs of said first exclusive OR circuit being connected one to said code output terminal and the other to said predetermined register stage Q output, said second exclusive OR circuit having its input connected, one to the output of said first exclusive OR circuit and the other to the output of said first means, said second OR exclusive circuit output being connected to provide the connection to said succeeding register stage following said predetermined register stage.

10. Apparatus according to claim 9 in which said bi-stable register stages are flip-flop circuits.

* * * * *